(12) United States Patent
Murakami et al.

(10) Patent No.: US 10,167,142 B2
(45) Date of Patent: Jan. 1, 2019

(54) ARTICLE TRANSPORT FACILITY

(71) Applicant: Daifuku Co., Ltd., Osaka-shi (JP)

(72) Inventors: Ryuya Murakami, Shiga (JP);
Yoshinari Wada, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 345 days.

(21) Appl. No.: 15/059,447

(22) Filed: Mar. 3, 2016

(65) Prior Publication Data
US 2016/0257498 A1   Sep. 8, 2016

(30) Foreign Application Priority Data

Mar. 4, 2015 (JP) .................................. 2015-042579

(51) Int. Cl.
*B65G 35/06* (2006.01)
*B61B 3/02* (2006.01)
*H01L 21/677* (2006.01)

(52) U.S. Cl.
CPC ................ *B65G 35/06* (2013.01); *B61B 3/02* (2013.01); *H01L 21/67733* (2013.01)

(58) Field of Classification Search
CPC ...... B65G 35/06; B61B 3/02; H01L 21/67733
See application file for complete search history.

(56) References Cited

U.S. PATENT DOCUMENTS

| 7,992,734 B2 * | 8/2011 | Campbell ......... H01L 21/67294 212/270 |
| 9,284,164 B2 * | 3/2016 | Fujiwara ........... H01L 21/67733 |
| 2007/0039513 A1 * | 2/2007 | Pinckney .................. B61B 3/02 104/279 |
| 2011/0024377 A1 * | 2/2011 | Yamamoto .......... H01L 21/6773 212/71 |
| 2016/0129921 A1 * | 5/2016 | Louw ....................... B61B 3/02 104/88.01 |

FOREIGN PATENT DOCUMENTS

JP       4701744 B2      3/2011
WO   WO-2014184780 A1 * 11/2014 ............... B61B 3/02

* cited by examiner

*Primary Examiner* — Zachary L Kuhfuss
(74) *Attorney, Agent, or Firm* — The Webb Law Firm

(57) ABSTRACT

A ceiling guided vehicle includes a travel driving portion, an elevation driving portion, and a control portion that controls the operation of the travel driving portion and the elevation driving portion. An auxiliary unit that supplies, to the ceiling guided vehicle, one or both of power for driving the travel driving portion and the elevation driving portion and a control signal is provided so as to be attachable to and removable from the ceiling guided vehicle. The auxiliary unit includes a supported portion configured to be supported in a suspended state on a supporting portion provided on the ceiling guided vehicle; and an abutment portion configured to abut against the ceiling guided vehicle in a plurality of abutment areas disposed at different positions in plan view, and the abutment areas are provided at positions lower than the supporting portion in a vertical direction.

7 Claims, 7 Drawing Sheets

ARTICLE TRANSPORT FACILITY

CROSS-REFERENCE TO RELATED APPLICATION

This application claims priority to Japanese Patent Application No. 2015-042579 filed Mar. 4, 2015, the disclosure of which is hereby incorporated in its entirety by reference.

FIELD OF THE INVENTION

The present invention relates to an article transport facility provided with a plurality of ceiling guided vehicles that travel along a traveling rail provided on the ceiling side.

BACKGROUND

In general, a ceiling guided vehicle of the above-described article transport facility is configured to be caused to travel by a power-driven travel driving portion, and also configured to include a control portion for controlling the operation of the ceiling guided vehicle. If the power supply portion or the control portion in such a ceiling guided vehicle has failed and the ceiling guided vehicle can no longer travel, there may be a situation where another ceiling guided vehicle can no longer travel in an area of the traveling rail in which the failed ceiling guided vehicle is stopped, resulting in a reduction in the article transport ability of the facility.

Therefore, for example, JP 4701744 discloses a technique by which, in the event of failure of the power supply portion or the control portion of a ceiling guided vehicle, an auxiliary unit including an external power supply portion and an external control portion is attached to the ceiling guided vehicle so as to replace the failed power supply portion or control portion with the external power supply portion or the external control portion of the auxiliary unit, thereby causing the failed ceiling guided vehicle to travel.

SUMMARY OF THE INVENTION

However, JP 4701744 does not disclose any specific configuration for attaching the auxiliary unit to the failed ceiling guided vehicle. Since ceiling guided vehicles travel on the traveling rail that is suspended from the ceiling and present at a high place away from the floor surface, the failed ceiling guided vehicle is in most cases also located at a high place. In the case of attaching the auxiliary unit to a ceiling guided vehicle that is stopped at a high place, the operator will perform the attaching operation in a state in which the operator has climbed up to a location near the height of the ceiling guided vehicle by using, for example, a stepladder or the like. Accordingly, the operation of attaching the auxiliary unit will be performed in an environment in which it is difficult to perform operations. Accordingly, it is desirable that the operation of attaching the auxiliary unit to the ceiling guided vehicle is as simple as possible.

In addition, since the ceiling guided vehicle is caused to travel in a state in which the auxiliary unit is attached to the ceiling guided vehicle, it is desirable that the auxiliary unit attached to the ceiling guided vehicle is attached to the ceiling guided vehicle in a stable manner.

Therefore, there is a need for an article transport facility including an auxiliary unit that can be attached to a ceiling guided vehicle in a simplest possible manner, and whose orientation is stable after the attachment.

An article transport facility according to a feature of the present disclosure includes a plurality of ceiling guided vehicles that travel along a traveling rail provided on a ceiling side, wherein each of the ceiling guided vehicle includes: a holding portion that holds an article to be transported; a body portion that supports the holding portion such that the holding portion can be moved up and down; a power-driven travel driving portion that drives the ceiling guided vehicle to travel; a power-driven elevation driving portion that drives the holding portion to move up and down; and a control portion that outputs a control signal and controls operation of the travel driving portion and the elevation driving portion, an auxiliary unit that supplies, to the ceiling guided vehicle, one or both of power for driving the travel driving portion and the elevation driving portion and the control signal is provided so as to be attachable to and removable from the ceiling guided vehicle, the auxiliary unit includes a supported portion configured to be supported in a suspended state on a supporting portion provided on the ceiling guided vehicle; and an abutment portion configured to abut against the ceiling guided vehicle in a plurality of abutment areas disposed at different positions in plan view, and the abutment areas are provided at positions lower than the supporting portion in a vertical direction.

That is, in the case of attaching the auxiliary unit to a ceiling guided vehicle, the operator will attach the auxiliary unit to a ceiling guided vehicle, for example, by lifting the auxiliary unit on his/her own from below the ceiling guided vehicle. With the article transport facility according to the present disclosure, the auxiliary unit can be supported in a suspended state on the ceiling guided vehicle by a very simple operation of hooking the supported portion of the auxiliary unit on the supporting portion provided in the ceiling guided vehicle. Then, after causing the auxiliary unit to be supported in a suspended state on the ceiling guided vehicle, the operator does not need to support the load of the auxiliary unit, and thus can easily perform subsequent necessary operations.

Since the auxiliary unit includes the abutment portion configured to abut against the ceiling guided vehicle at a plurality of abutment areas disposed at different positions in plan view, the orientation of the auxiliary unit relative to the ceiling guided vehicle (in particular, the relative position of the auxiliary unit to the ceiling guided vehicle in a horizontal direction) can be stabilized.

Since the abutment areas against which the abutment portion abut are located at positions lower than the supporting portion in the vertical direction, it is possible to prevent a situation where the auxiliary unit is pivoted about the supporting portion as a pivot fulcrum, making it possible to stabilize the orientation of the auxiliary unit after the auxiliary unit has been attached to the ceiling guided vehicle.

As described above, according to the present characteristic feature, it is possible to provide an article transport facility including an auxiliary unit that can be attached to a ceiling guided vehicle in a simplest possible manner, and whose orientation is stable after the attachment.

DETAILED DESCRIPTION

Hereinafter, an embodiment in which an article transport facility is applied to a ceiling transport facility will be described with reference to the drawings.

Figure 1:
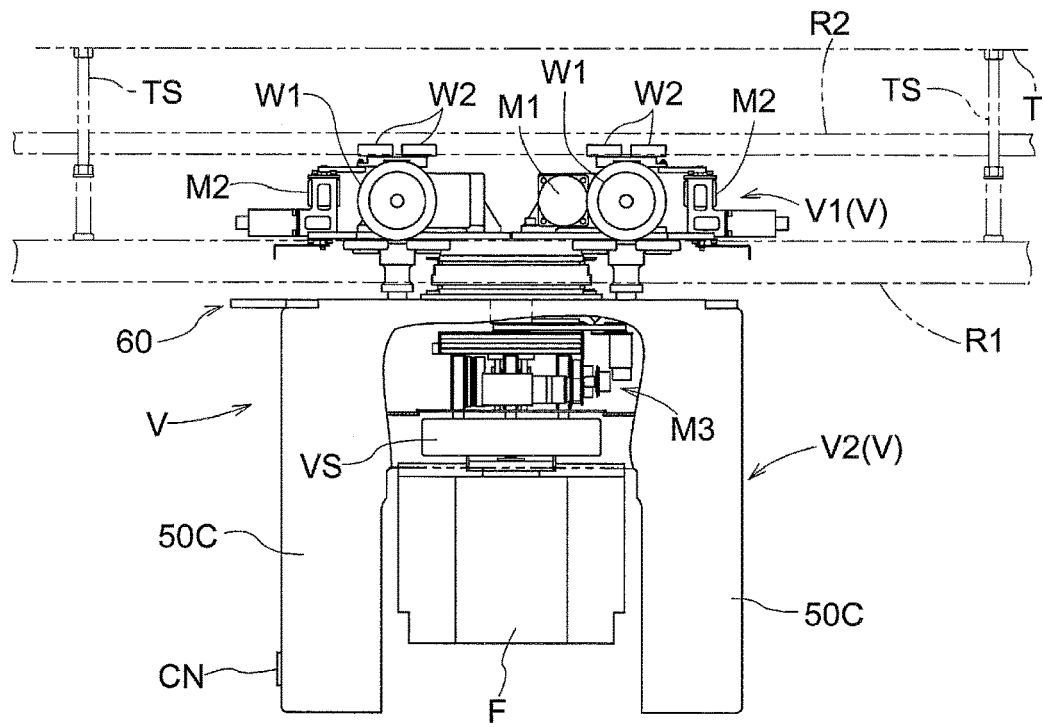
FIG. 1 is a partial broken-away side view of a ceiling guided vehicle.
Figure 2:
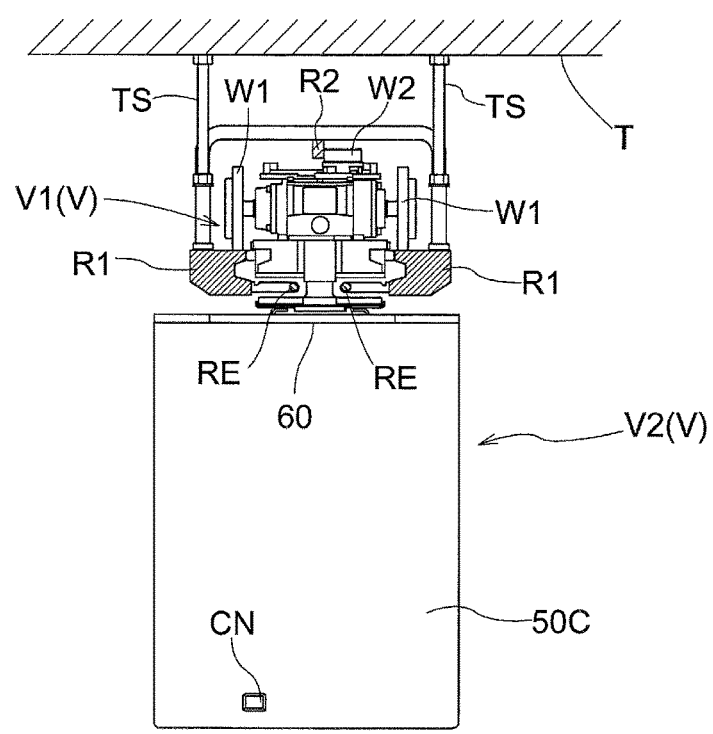
FIG. 2 is a front view of the ceiling guided vehicle.

As shown in FIGS. 1 and 2, the ceiling transport facility includes traveling rails R1 provided on a ceiling T side in a state in which they are suspended from the ceiling T by suspension support members TS, and a ceiling guided vehicle V that travels along the traveling rails R1. Although not shown, the ceiling transport facility is provided with a plurality of ceiling guided vehicles V.

Each of the ceiling guided vehicles V includes a traveling portion V1 including traveling wheels W1 capable of traveling on the traveling rails R1 and a body portion V2 that is suspended from and supported on the traveling portion V1. The traveling portion V1 is provided with a power-driven traveling motor M1 that rotates the traveling wheels W1 to drive the ceiling guided vehicle V to travel, and a guide roller solenoid M2 that drive the guide rollers W2. The body portion V2 is configured to support a holding portion VS that holds an article F to be transported (in the present embodiment, a FOUP accommodating semiconductor substrates in a stacked state) such that the holding portion VS can be moved up and down. Then, the ceiling guided vehicle V is configured to be capable of traveling, with the article F to be transported being held by the holding portion VS. Note that the holding portion VS includes a gripping portion for gripping a flange provided at the upper end of the article F. However, a known configuration is adopted for this holding portion and the description thereof shall thus be omitted.

Note that a negative brake N (see FIG. 5) is included in a transmission mechanism including a transmission shaft that transmits the rotational output of the traveling motor M1 to the traveling wheels W1. The negative brake N is configured to be in a braking state of braking the rotation of the transmission shaft by the biasing force of a biasing member contained in the traveling motor M1 when power is not supplied, and to be released from the braking state by supply of power.

Each of the guide rollers W2 is configured to be movable in the lateral direction as viewed in the traveling direction of the traveling portion V1 (as viewed in the depth direction in FIG. 2). Additionally, the power-driven guide roller solenoid M2 is provided that switches the position of the guide roller W2 between the left position and the right position in the lateral direction and holds the guide roller W2 at the switched position. The guide roller W2 is configured to be in contact with the left side surface of a guide rail R2 as viewed from the traveling direction of the traveling portion V1 when it is located at the above-described left position, and to be in contact with the right side surface of the guide rail R2 as viewed from the traveling direction of the traveling portion V1 when it is located at the above-described right position. Although not shown, by causing the guide roller W2 to abut against the right side surface or the left side surface of the guide rail R2, it is possible to switch between whether to cause the ceiling guided vehicle V to travel in a rightward branch route or to cause the ceiling guided vehicle V to travel in a leftward branch route at a branched part of the traveling rail R1.

The body portion V2 is provided with a power-driven elevation driving portion M3 that drives the holding portion VS to move up and down, and a control portion H (see FIG. 5) that outputs a control signal and controls the operation of the traveling motor M1, the guide roller solenoid M2, the elevation driving portion M3, and the negative brake N. Note that the control targets of the control portion H are not limited to the above-described four driving portions, and the control portion H may be configured to control various devices necessary for the operation and use of the ceiling guided vehicle V.

That is, the article transport facility includes a ceiling guided vehicle V that travels along traveling rails R1 provided on the ceiling T side. The ceiling guided vehicle V includes: a holding portion VS that holds an article F to be transported; a body portion V2 that supports the holding portion VS such that the holding portion VS can be moved up and down; a power-driven traveling motor M1 that drives the ceiling guided vehicle V to travel; a power-driven elevation driving portion M3 that drives the holding portion VS to move up and down; and a control portion H that outputs a control signal and controls the operation of the traveling motor M1 and the elevation driving portion M3.

As shown in FIG. 1, the body portion V2 includes a cover portion 50C extending forward and backward in the traveling direction. The cover portion 50C is formed in a C shape that is open downward in side view (as viewed in a direction that is orthogonal to the traveling direction of the traveling portion V1 and extending along the horizontal direction).

Figure 3:
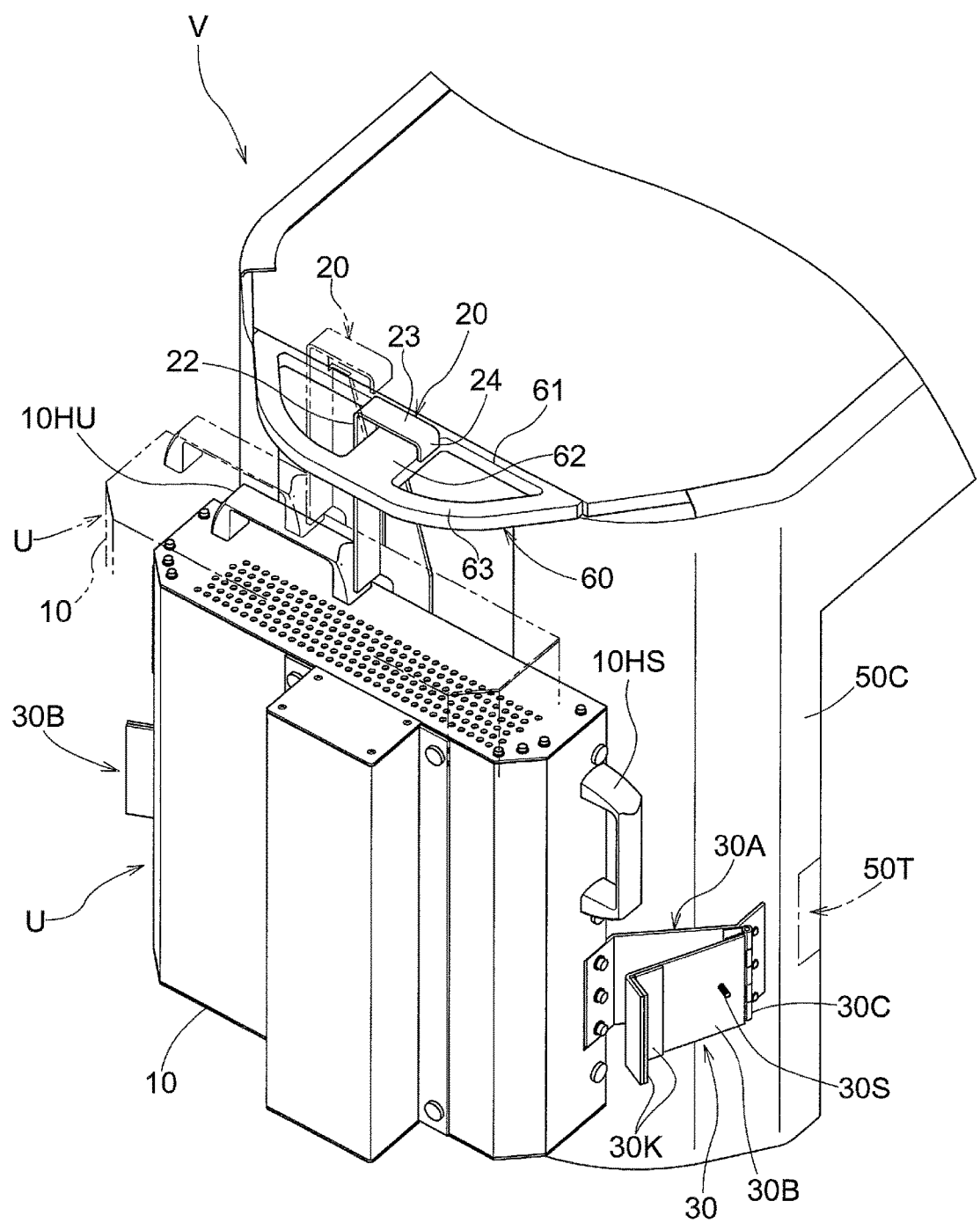
FIG. 3 is a diagram showing an operation of suspending and supporting an auxiliary unit on the ceiling guided vehicle.
Figure 4:
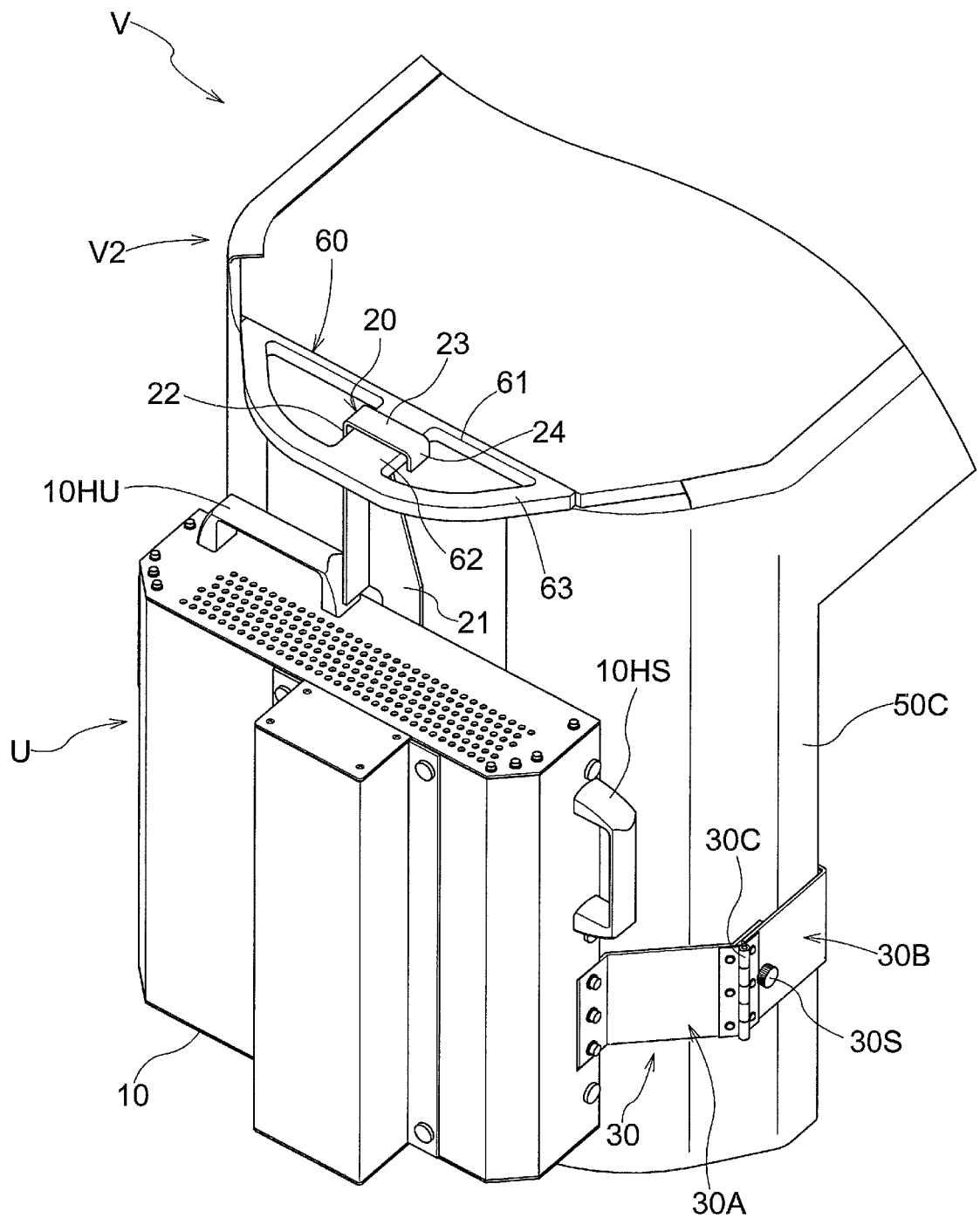
FIG. 4 is a diagram showing a state in which the auxiliary unit is suspended and supported on the ceiling guided vehicle.

As shown in FIGS. 1 to 4, a supporting portion 60 for suspending and supporting a supported portion 20 of an auxiliary unit U, which will be described below, is attached at a position that is located at the upper end of the cover portion 50C and at one end of the traveling direction of the ceiling guided vehicle V. As shown in FIGS. 3 and 4, the supporting portion 60 includes a first part 61 extending along the side surface of the cover portion 50C at one end in the traveling direction, a second part 62 extending from the first part 61 toward the side where the cover portion 50C is not present in the traveling direction of the ceiling guided vehicle V, and a third part 63 connecting an end of the second part 62 that is on the side opposite to the cover portion 50C with two portions of the first part 61 that are spaced apart in the lateral direction of the cover portion 50C. Here, "lateral direction" refers to a direction that is orthogonal to the traveling direction of the ceiling guided vehicle V and extends along the horizontal direction, or in other words, a direction that is orthogonal to the traveling direction of the ceiling guided vehicle V in plan view (a lateral width direction described below). In the present embodiment, the first part 61 is formed so as to extend in the lateral direction, along the side surface of the cover portion 50C at one end in the traveling direction.

Figure 5:
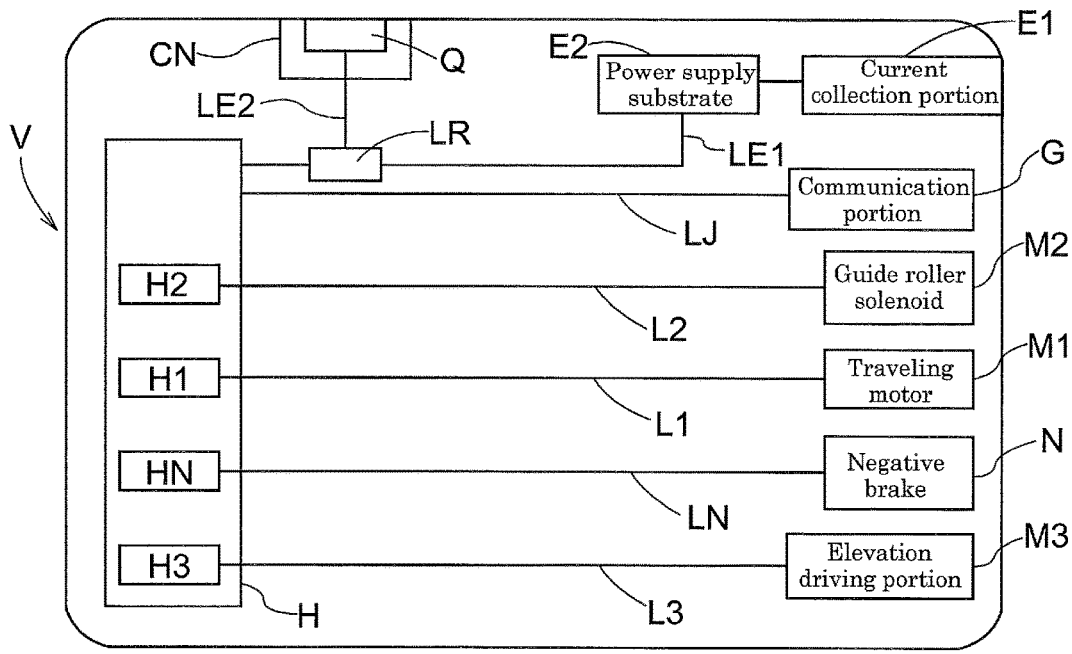
FIG. 5 is a control block diagram of the ceiling guided vehicle.

Next, a control configuration of the ceiling guided vehicle V will be described with reference to FIG. 5.

In the ceiling transport facility of the present embodiment, power is supplied in a non-contact manner to the ceiling guided vehicle V from feeding rails RE (see FIG. 2) provided along the traveling rails R1. The ceiling guided vehicle V is provided with a current collection portion E1 that collects power from the feeding rails RE, and a power supply substrate E2 that rectifies the power collected by the current collection portion E1 and raises/lowers the power to a predetermined voltage in order to provide power for driving various portions of the ceiling travelling vehicle. Further, the ceiling guided vehicle V is provided with a communication portion G that receives instruction information transmitted using radio waves or light, such as a transport instruction, in addition to the traveling motor M1, the guide roller solenoid M2, the elevation driving portion M3, the negative brake N and so forth described above. Additionally, the ceiling guided vehicle V is provided with a control portion H that controls the operation of the various parts of the ceiling guided vehicle V based on the instruction information received by the communication portion G. The communication portion G and the control portion H are connected by a communication control line LJ.

The power supply substrate E2 is electrically connected to the control portion H via an internal power supply line LE1, and operating power is supplied to the control portion H by the power supply substrate E2. The control portion H includes, for example, a control substrate constituted by a microcomputer, an arithmetic unit or the like, and a power control substrate including a relay for switching the supply state of power to the traveling motor M1, the guide roller solenoid M2, the elevation driving portion M3, and the negative brake N.

The communication portion G transmits information such as an operational result of the ceiling guided vehicle V to a superordinate management device.

The control portion H includes a traveling motor control portion H1 that controls the supply state of driving power to the traveling motor M1, a guide roller solenoid control portion H2 that controls the supply state of driving power to the guide roller solenoid M2, an elevation control portion H3 that controls the supply state of driving power to the elevation driving portion M3, and a negative brake control portion HN that controls the supply state of power for releasing the negative brake N.

The traveling motor control portion H1 and the traveling motor M1 are connected by a control line L1, the guide roller solenoid control portion H2 and the guide roller solenoid M2 are connected by a control line L2, the elevation control portion H3 and the elevation driving portion M3 are connected by a control line L3, and the negative brake control portion HN and the negative brake N are connected by a control line LN. In the present embodiment, the power for operating the traveling motor M1, the guide roller solenoid M2, the elevation driving portion M3, and the negative brake N is supplied from the control portion H via the control lines L1, L2, L3, and L4.

One end of an auxiliary internal power supply line LE2 is connected to a connector terminal Q of a connector portion CN located on one side of the traveling portion V1 in the traveling direction, and the other end of the auxiliary internal power supply line LE2 is connected to a switching relay LR provided between the power supply substrate E2 and the control portion H in the internal power supply line LE1. The switching relay LR is used to switch the supply path of power to the control portion H between a path for supplying power from the internal power supply line LE1 to the control portion H, and a path (auxiliary path) for supplying power from the auxiliary internal power supply line LE2 to the control portion H. Specifically, upon start of supply of power from the connector terminal Q of the connector portion CN, the supply path of power from the auxiliary internal power supply line LE2 to the control portion H is formed automatically, and the supply path of power from the internal power supply line LE1 to the control portion H is disconnected. In the present embodiment, as shown in FIGS. 1 and 2, the connector portion CN is formed on an end face of the cover portion 50C on one side in the traveling direction of the ceiling guided vehicle V.

In the present embodiment, in the event of a failure in a feeding system of the ceiling guided vehicle V, the auxiliary unit U is mounted to the ceiling guided vehicle. The following is a description of a method for mounting the auxiliary unit U for causing a ceiling guided vehicle V to travel/move to another location (e.g., a predetermined repair waiting location or a desired traveling position) when the ceiling guided vehicle V has stopped along the traveling path due to the occurrence of a failure in a feeding device (not shown) that supplies power to the feeding rails RE of the ceiling transport facility or a failure in the current collection portion E1 or the power supply substrate E2 of the ceiling guided vehicle V.

Note that the auxiliary unit U is attached to the ceiling guided vehicle V in an orientation in which a hook-shaped supported portion 20, which will be described below, protrudes upward, as shown in FIGS. 3 and 4. Hereinbelow, the orientation in which the supported portion 20 protrudes upward is simply called "mounted orientation".

Figure 6:
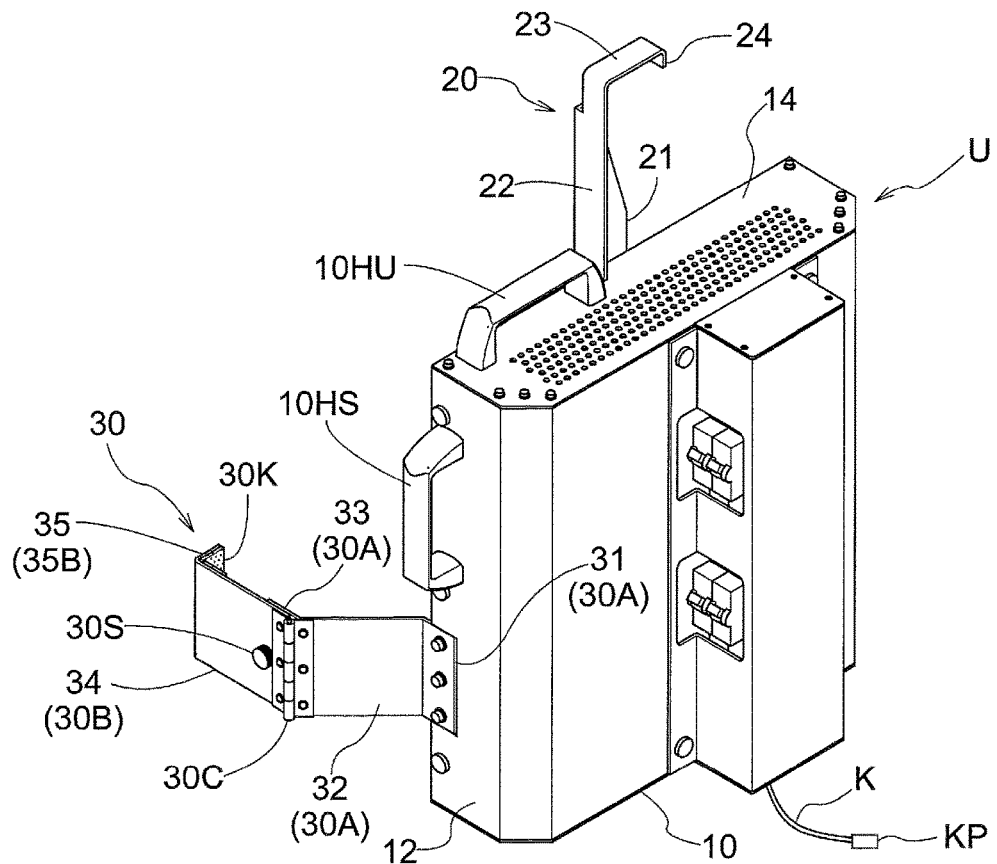
FIG. 6 is rear perspective view of the auxiliary unit.

The auxiliary unit U is configured by incorporating an auxiliary feeding device (not shown) including a storage battery, a booster, a rectifier, and a breaker with a casing 10. As shown in FIG. 6, an auxiliary feeding cable K is drawn from the casing 10 to the outside, and a plug KP capable of being attached to and detached from the connector portion CN as described above is provided at an end of the auxiliary feeding cable K on the outside of the casing 10. When the plug KP is attached to the connector portion CN provided in the ceiling guided vehicle V, the auxiliary feeding device in the auxiliary unit U and the auxiliary internal power supply line LE2 of the ceiling guided vehicle V are electrically connected. Consequently, the switching relay LR as described above is operated to form the supply path of power from the auxiliary internal power supply line LE2 to the control portion H, and to supply power from the auxiliary internal power supply line LE2 to the control portion H. As a result of power being supplied to the control portion H, the control portion H can receive the instruction information or transmit information regarding an operational result via the communication portion G, and can operate the traveling motor M1, the guide roller solenoid M2, the elevation driving portion M3, and the negative brake N.

Figure 7:
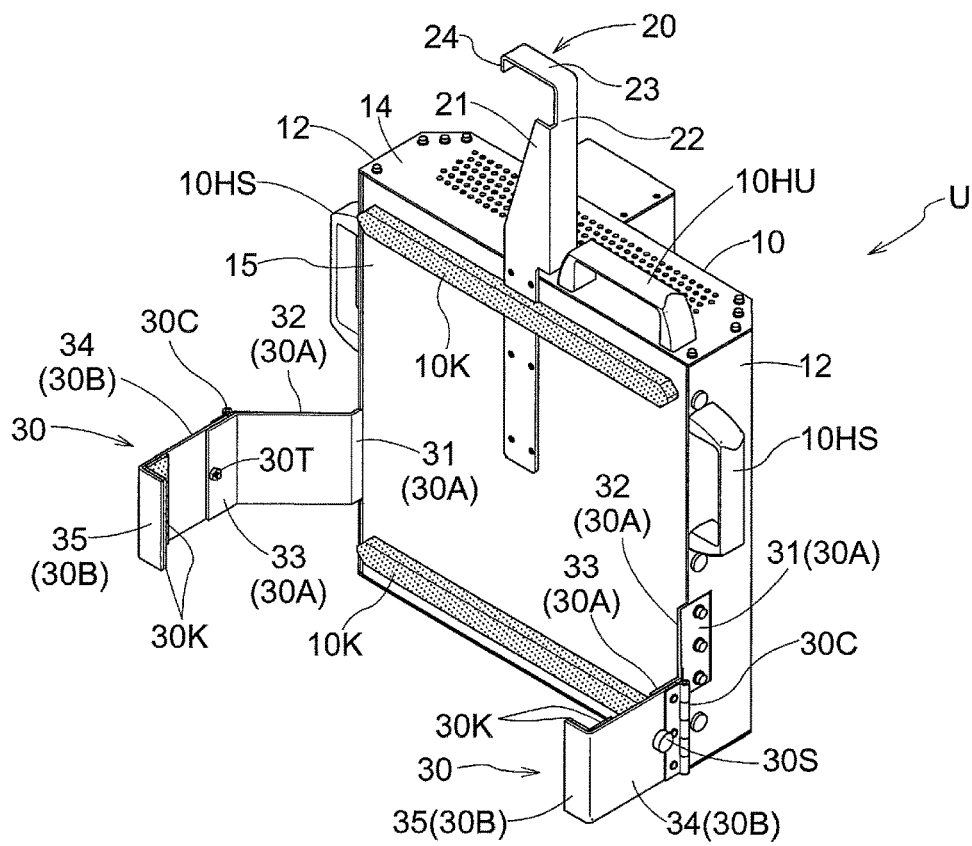
FIG. 7 is a front perspective view of the auxiliary unit.

The casing 10 of the auxiliary unit U is formed in a box shape by shaping a metal plate by bending, as shown in FIGS. 6 and 7. A plurality of heat-dissipating punched holes are formed in an upper surface plate 14 of the casing 10. In addition, an upper handle 10HU for carrying is attached to the upper surface plate 14.

A side handle 10HS is attached to each of left and right side plates 12 of the casing 10 at the same height position in the vertical direction in the mounted orientation.

Figure 8:
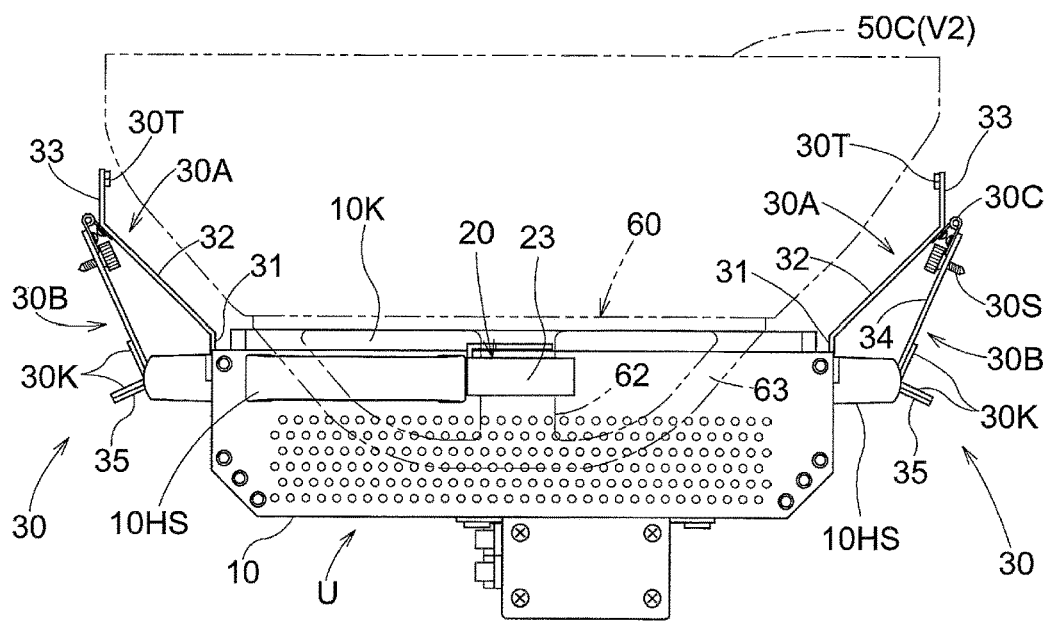
FIG. 8 is a plan view showing a state in which abutting parts are in a hold-release orientation.
Figure 9:
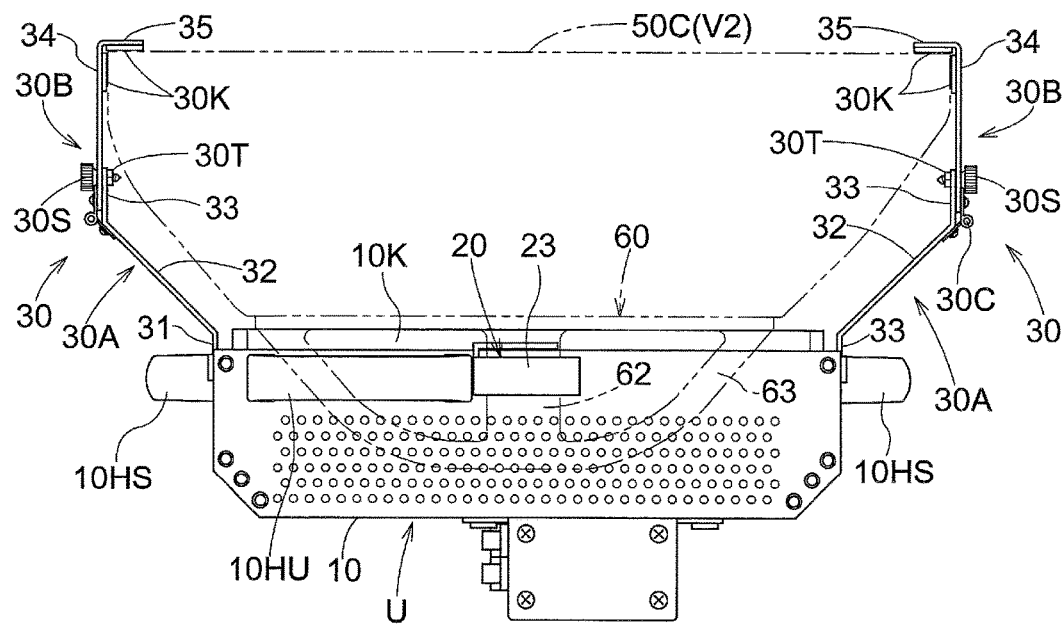
FIG. 9 is a plan view showing a state in which the abutting parts are in a hold orientation.
Figure 10:
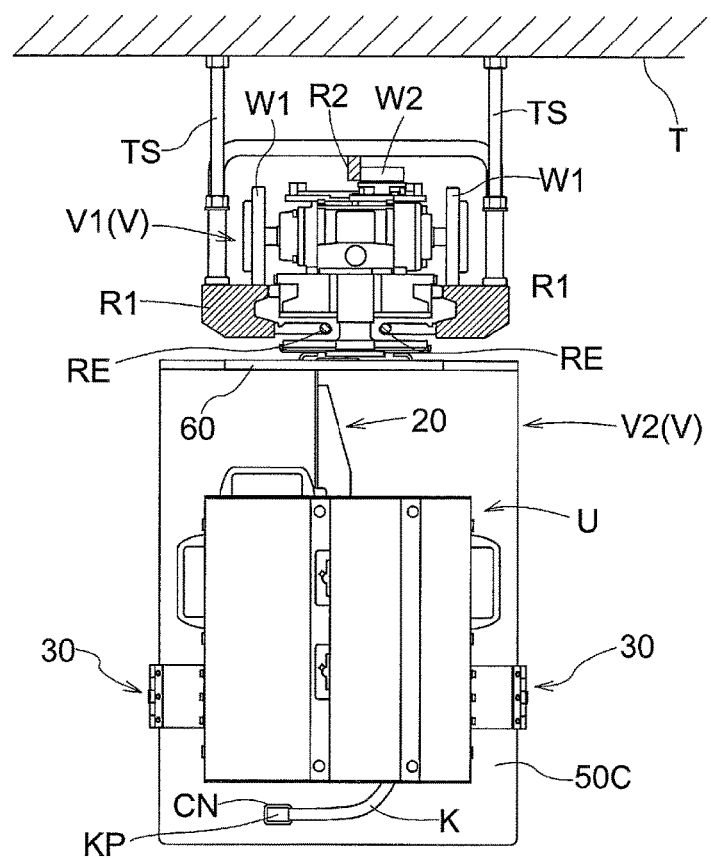
FIG. 10 is a front view showing a state in which the auxiliary unit is mounted to the ceiling guided vehicle.

As shown in FIGS. 7 and 10, an abutting arm 30 is provided on each of the left and right side plates 12. That is, the auxiliary unit U includes a pair of abutting arms 30. In the present embodiment, the pair of abutting arms 30 are provided at positions lower in the vertical direction in the mounted orientation than the positions at which the side handles 10HS are attached. The pair of abutting arms 30 are provided at the same position in the vertical direction. The abutting arms 30 are located on opposite sides in a lateral width direction that is orthogonal to the traveling direction of the ceiling guided vehicle V in plan view in a mounted state in which the auxiliary unit U is mounted to the ceiling guided vehicle V. That is, the pair of abutting arms 30 are disposed separately on opposite sides in the lateral width direction in the mounted state. As shown in FIGS. 7 to 9, each of the abutting arms 30 includes a fixed arm portion 30A whose orientation relative to the casing 10 is fixed, and a pivot arm portion 30B that is connected with the fixed arm portion 30A by a hinge 30C that pivots about an up-down axis (vertical axis), and pivots about the vertical axis relative to the casing 10.

As shown in FIGS. 8 and 9, the fixed arm portion 30A includes a first part 31 extending along the side plate 12 as viewed in the vertical direction (in plan view), a second part 32 extending continuously with the first part 31 and located on a side away from the casing 10 in the lateral direction as it moves away from the first part 31, and a third part 33 extending continuously with the second part 32 and formed to be in an orientation parallel to the first part 31. In addition, a nut portion 30T with which a fastening screw 30S, which will be described below, is threadably engaged is provided at the third part 33. One end of the hinge 30C is fixed at the end of the second part 32 on the third part 33 side and on a surface on the side opposite to the casing 10.

Each of the pivot arm portions 30B includes a pivot first part 34 and a pivot second part 35 that is bent at a right angle to the pivot first part 34 in a direction approaching the other pivot second part 35 as viewed in the vertical direction. In addition, the other end of the hinge 30C is fixed at the end of the pivot first part 34 on the side opposite to the pivot second part 35. Accordingly, the pivot arm portion 30B is pivotable between a hold-release orientation shown in FIG. 8 and a hold orientation shown in FIG. 9, relative to the fixed arm portion 30A. Note that each of the pivot second parts 35 is formed in a shape that is bent at a right angle to the pivot first part 34 in a direction approaching the other pivot second part 35 as viewed in the vertical direction in the hold orientation.

Furthermore, of the surfaces (outer surfaces) of the pivot first part 34 and the pivot second part 35, a buffer member 30K such as a foamed rubber is attached to surfaces located on the side where the angle formed between the surface along which the pivot first part 34 extends and the surface along which the pivot second part 35 extends is smaller as viewed in the vertical direction.

The supported portion 20 includes a first part 21, a second part 22, a third part 23, and a fourth part 24. The lower end of the first part 21 is fixed to a ventral surface plate 15 (see FIG. 7) of the casing 10 that is located on the ceiling guided vehicle V side in the mounted state in which the auxiliary unit U is mounted to the ceiling guided vehicle V. The second part 22 is formed so as to extend in the vertical direction toward a position upper than the upper surface plate 14. The lower portion of the second part 22 is connected with the upper portion of the first part 21. The third part 23 is formed by being bent at a right angle at the upper end of the second part 22. That is, the third part 23 is formed so as to extend from the upper end of the second part 22 along the horizontal direction (in the present example, the lateral direction). The fourth part 24 is formed by being bent downward at the end of the third part 23 on the side opposite to the portion connected with the second part 22. That is, the fourth part 24 is formed so as to extend downward from the end of the third part 23 on the side opposite to the portion connected with the second part 22. Accordingly, the supported portion 20 is formed in a hook shape by the third part 23 formed by being bent at a right angle at the upper end of the second part 22 and the fourth part 24 formed by being bent downwardly at the above-described end of the third part 23. The length of downward extension of the fourth part 24 may be such that the second part 62 and the supported portion 20 will not be disengaged due to pivoting when the auxiliary unit U is hooked on the second part 62 of the supporting portion 60 so as to be suspended and supported on the ceiling guided vehicle V (see FIGS. 3 and 4). It is preferable to form the fourth part 24 so as to have a length that is the same as the thickness of the second part 62 in the vertical direction, or a length that is slightly longer than that thickness. The supported portion 20 is configured such that, in the mounted state in which the auxiliary unit U is mounted to the ceiling guided vehicle V, the suspension fulcrum at the supported portion 20 is located at a gravity center position (the gravity center position of the auxiliary unit U) in a lateral width direction that is orthogonal to the traveling direction of the ceiling guided vehicle V in plan view. That is, the position of the suspension fulcrum in the above-described lateral width direction in the mounted state coincides with the gravity center position of the auxiliary unit U in the lateral width direction. Additionally, a buffer member 10K such as foamed rubber is attached to the part of the ventral surface plate 15 that abuts against the ceiling guided vehicle V when the auxiliary unit U is mounted to the ceiling guided vehicle V, as shown in FIG. 7.

In the case of mounting such an auxiliary unit U to the ceiling guided vehicle V, a stepladder, a workbench or the like is set on the floor surface so as be able to approach the vicinity of a ceiling guided vehicle V that is stopped along the traveling path, and the operator grips the upper handle 10HU or the side handle 10HS and lifts the auxiliary unit U to the vicinity of the ceiling guided vehicle V. Note that lifting of the auxiliary unit U may not be performed by the operator as in the case described above, and may be performed using any of various devices such as a lifter.

Prior to mounting of the auxiliary unit U to the ceiling guided vehicle V, the operator switches the pivot arm portions 30B of the abutting arms 30 of the auxiliary unit U to the hold-release orientation, as shown in FIG. 8. Thereafter, as indicated by the dashed double-dotted line in FIG. 3, the auxiliary unit U is moved upward such that the lower end of the fourth part 24 of the supported portion 20 of the auxiliary unit U is located at a position higher than the upper end of the second part 62 of the supporting portion 60 of the ceiling guided vehicle V, with the third part 23 of the supported portion 20 of the auxiliary unit U being located at a position that does not overlap the second part 62 of the supporting portion 60 of the ceiling guided vehicle V in plan view (in the present embodiment, a position at which the entire third part 23 is included, in plan view, in an opening surrounded by the first part 61, the second part 62, and the third part 63). Then, as indicated by the solid line in FIG. 3, the auxiliary unit U is moved to a position at which the third part 23 of the supported portion 20 of the auxiliary unit U overlaps the second part 62 of the supporting portion 60 of the ceiling guided vehicle V in plan view, and subsequently, the auxiliary unit U is moved downward. Consequently, the auxiliary unit U can be supported in a suspended state on the ceiling guided vehicle V, as shown in FIG. 4.

After causing the auxiliary unit U to be supported in a suspended state on the ceiling guided vehicle V, the operator switches the pivot arm portions 30B of the abutting arms 30 of the auxiliary unit U to the hold orientation (FIG. 9) to threadably engage the fastening screws 30S with the nut portions 30T. Consequently, the buffer members 30K attached to each of the pivot arm portions 30B abut against the part indicated by the dashed dotted line in FIG. 3 (the area denoted by 50T; hereinafter referred to as "abutment area 50T"). The pair of pivot arm portions 30B abut against abutment areas 50T that are different from each other in a state in which they are switched to the hold orientation.

Figure 11:
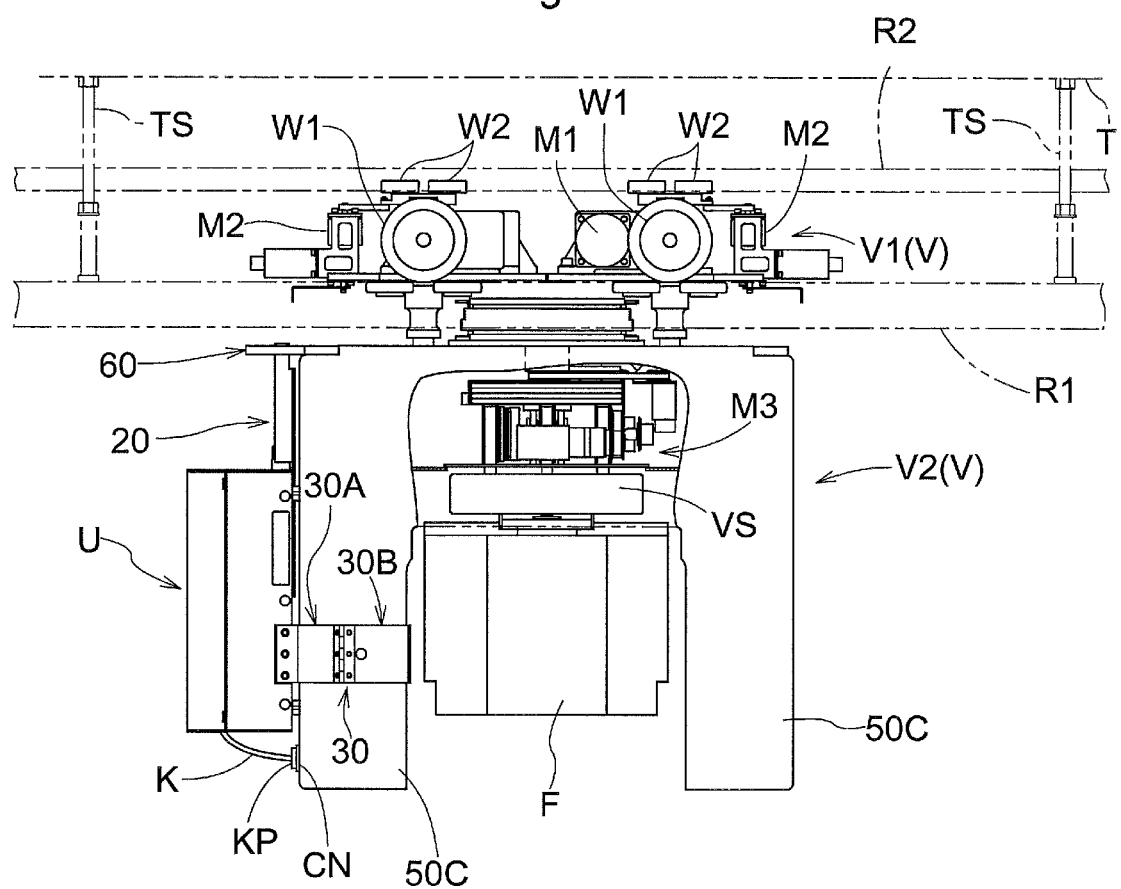
FIG. 11 is a side view showing a state in which the auxiliary unit is mounted to the ceiling guided vehicle.

As a result of the above-described operation, the auxiliary unit U is mounted to the ceiling guided vehicle V in a state in which the pivot arm portions 30B of the pair of abutting arms 30 embrace the cover portion 50C of the body portion V2, as shown in FIGS. 10 and 11. The operator can cause the auxiliary unit U to be supported in a suspended state on the ceiling guided vehicle V by simply moving the auxiliary unit U such that the upwardly protruding supported portion 20 is hooked on the supporting portion 60. Furthermore, the operator can fix the relative position of the auxiliary unit U with respect to the ceiling guided vehicle V by simply switching the pivot arm portions 30B from the hold-release orientation to the hold orientation. Accordingly, it is possible to achieve a ceiling transport facility including an auxiliary unit U in which the orientation of the auxiliary unit U relative to the ceiling guided vehicle V will not be destabilized due to pivoting of the auxiliary unit U even when the ceiling guided vehicle V is caused to travel in a state in which the auxiliary unit U is mounted thereto, without requiring any troublesome operation at a high place where it is difficult for the operator to perform operations.

In the present embodiment, the traveling motor M1 corresponds to the "travel driving portion", the parts of the pivot first part 34 and the pivot second part 35 where the buffer members 30K are provided (parts of the abutting arm 30) correspond to the "abutting parts", and the part indicated by the dashed dotted line on the cover portion 50C in FIG. 3 corresponds to the "abutment area 50T". Also, in the present embodiment, the abutment portion that abuts against the ceiling guided vehicle V in the plurality of abutment areas 50T disposed at different positions in plan view includes a pair of abutting parts. In the present embodiment, the pair of abutting parts are provided at the same position in the vertical direction.

That is, an auxiliary unit U that supplies, to the ceiling guided vehicle V, power for driving the traveling motor M1 and the elevation driving portion M3 is provided so as to be attachable to and removable from the ceiling guided vehicle V, the auxiliary unit U includes a supported portion 20 configured to be supported in a suspended state on a supporting portion 60 provided on the ceiling guided vehicle V; and an abutment portion (in the present example, the pair of abutting arms 30) configured to abut against the ceiling guided vehicle V in a plurality of abutment areas 50T disposed at different positions in plan view, and the abutment areas 50T are provided at positions lower than the supporting portion 60 in a vertical direction. Also, both the supporting portion 60 and the abutment areas 50T are provided on the body portion V2. Furthermore, each of the pair of abutting arms 30 is configured to be switchable between a hold orientation in which the abutting arm 30 is caused to abut against the corresponding abutment area 50T, and a hold-release orientation in which the abutting arm 30 is moved away from the abutment area 50T, by being pivoted about a vertical axis.

In the present embodiment, the fastening screw 30S and the nut portion 30T correspond to the pressing force adjustment mechanism for adjusting the pressing force with which the pivot arm portion 30B of the abutting arm 30 presses the abutment area 50T. That is, each of the pair of abutting arms 30 is configured to press the corresponding abutment area 50T in a state in which the abutting arm 30 is in the hold orientation, and each of the pair of abutting arms 30 is provided with a fastening screw 30S and a nut portion 30T for adjusting a pressing force for pressing the abutment area 50T.

After switching the pivot arm portions 30B of the abutting arms 30 from the hold-release orientation to the hold orientation, the operator manually rotates the fastening screw 30S so as to be threadably engaged with the nut portion 30T, thereby making it possible to maintain the pivot arm portion 30B in the hold orientation. Also, the pressing force with which the pivot arm portion 30B presses the abutment area 50T can be adjusted by adjusting the number of revolutions of the fastening screw 30S when threadably engaging the fastening screw 30S with the nut portion 30T to adjust the relative positions between the fastening screw 30S and the nut portion 30T in the longitudinal direction of the fastening screw 30S.

By attaching the auxiliary unit U to the ceiling guided vehicle V in the above-described manner, power is supplied to the control portion H of the ceiling guided vehicle V via the auxiliary feeding cable K. Consequently, power is supplied to the traveling motor M1, the guide roller solenoid M2, the elevation driving portion M3, the negative brake N, the communication portion G and so forth of the ceiling guided vehicle V. Accordingly, the ceiling guided vehicle V can be self-propelled to a desired travel position (e.g., a retracted area in the event of failure) by transmitting travel instruction information to the communication portion G by using a remote controller (not shown) or the like.

ALTERNATIVE EMBODIMENTS (1) Although the auxiliary unit U supplies power for driving the traveling motor M1 and the elevation driving portion M3 of the ceiling guided vehicle V in the above embodiment, it is possible to adopt a configuration in which the auxiliary unit U supplies a control signal for controlling the operation of the traveling motor M1 and the elevation driving portion M3 to the ceiling guided vehicle V, in addition to supplying power for driving the traveling motor M1 and the elevation driving portion M3. It is also possible to adopt a configuration in which the auxiliary unit U supplies only a control signal for controlling the operation of the traveling motor M1 and the elevation driving portion M3 to the ceiling guided vehicle V.

(2) Although the above embodiment has described a configuration in which the supporting portion 60 is provided at one end of the cover portion 50C in the traveling direction, the supporting portion 60 may be provided at both ends of the cover portion 50C in the traveling direction.

(3) Although the above embodiment has described a configuration in which the abutment area 50T is provided at a position lower than the supporting portion 60 in the vertical direction, the present disclosure is not limited to such a configuration. It is also possible to adopt a configuration in which the abutment area 50T is provided so as to overlap the supporting portion 60 in the vertical direction (the arrangement positions in the vertical direction overlap), or a configuration in which the abutment area 50T is provided so as to be located at an upper position in the vertical direction relative to the supporting portion 60.

(4) Although the above embodiment has shown an example in which the supported portion 20 has a hook shape including the second part 22 extending along the vertical direction, the third part 23 extending in the horizontal direction, and the fourth part 24 that is bent downward relative to the third part 23, it is possible to form the supported portion 20, for example, in an L-shape in which the fourth part 24 is omitted. In this case, in order to limit the relative movement between the second part 62 of the supporting portion 60 and the third part 23 of the supported portion 20, a movement limiting member made of a material having a large coefficient of friction may be attached to one or both of the upper surface of the second part 62 and the lower surface of the third part 23. The above embodiment has shown an example in which the lower surface of the third part 23 of the supported portion 20 and the upper surface of the second part 62 of the supporting portion 60 are formed to be linear in a cross-sectional shape (cross-sectional shape orthogonal to the traveling direction). However, the lower surface of the third part 23 of the supported portion 20 may be formed in a curved shape recessed upward in a cross-sectional shape, and the upper surface of the second part 62 of the supporting portion 60 may be formed in a curved shape protruding upward in a cross-sectional shape.

(5) Although the above embodiment has described a configuration in which each of the pair of abutting arms 30 includes the fastening screw 30S and the nut portion 30T serving as the pressing force adjustment mechanism for adjusting the pressing force with which the abutting arm 30 presses the abutment area 50T, it is possible to adopt a configuration in which the abutting arm 30 presses the abutment area 50T with a predetermined force by using a biasing member such as a spring in the hold orientation, without providing the pressing force adjustment mechanism. In this case, it is preferable to adopt a configuration in which the pivot arm portion 30B is biased toward one of the hold orientation and the hold-release orientation, with the dead point as a boundary.

(6) Although the embodiment adopts a configuration in which the abutment portion includes the pair of abutting arms 30 that are located on opposite sides of the ceiling guided vehicle V in the lateral width direction that is orthogonal to the traveling direction in plan view in the mounted state in which the auxiliary unit U is mounted to the ceiling guided vehicle V, the present disclosure is not limited to such a configuration. For example, it is possible to adopt a configuration in which the abutment portion includes an engaging portion configured to be fastened to or engaged with one or more fixtures provided on the body portion V2 of the ceiling guided vehicle V. In this case, the fixtures provided on the body portion V2 serve as the abutment area.

OUTLINE OF THE EMBODIMENT

The following describes an outline of the article transport facility described above.

An article transport facility including a plurality of ceiling guided vehicles that travel along a traveling rail provided on a ceiling side, wherein each of the ceiling guided vehicle includes: a holding portion that holds an article to be transported; a body portion that supports the holding portion such that the holding portion can be moved up and down; a power-driven travel driving portion that drives the ceiling guided vehicle to travel; a power-driven elevation driving portion that drives the holding portion to move up and down; and a control portion that outputs a control signal and controls operation of the travel driving portion and the elevation driving portion, an auxiliary unit that supplies, to the ceiling guided vehicle, one or both of power for driving the travel driving portion and the elevation driving portion and the control signal is provided so as to be attachable to and removable from the ceiling guided vehicle, the auxiliary unit includes a supported portion configured to be supported in a suspended state on a supporting portion provided on the ceiling guided vehicle; and an abutment portion configured to abut against the ceiling guided vehicle in a plurality of abutment areas disposed at different positions in plan view, and the abutment areas are provided at positions lower than the supporting portion in a vertical direction.

That is, in the case of attaching the auxiliary unit to a ceiling guided vehicle, the operator will attach the auxiliary unit to a ceiling guided vehicle, for example, by lifting the auxiliary unit on his/her own from below the ceiling guided vehicle. With the article transport facility according to the present disclosure, the auxiliary unit can be supported in a suspended state on the ceiling guided vehicle by a very simple operation of hooking the supported portion of the auxiliary unit on the supporting portion provided in the ceiling guided vehicle. Then, after causing the auxiliary unit to be supported in a suspended state on the ceiling guided vehicle, the operator does not need to support the load of the auxiliary unit, and thus can easily perform subsequent necessary operations for attachment.

Since the auxiliary unit includes the abutment portion configured to abut against the ceiling guided vehicle at a plurality of abutment areas disposed at different positions in plan view, the orientation of the auxiliary unit relative to the ceiling guided vehicle (in particular, the relative position of the ceiling guided vehicle to the auxiliary unit in the horizontal direction) can be stabilized.

Since the abutment areas against which the abutment portion abut are located at positions lower than the supporting portion in the vertical direction, it is possible to prevent a situation where the auxiliary unit is pivoted about the supporting portion as a pivot fulcrum, making it possible to stabilize the orientation of the auxiliary unit after the auxiliary unit has been attached to the ceiling guided vehicle.

As described above, according to the present configuration, it is possible to provide an article transport facility including an auxiliary unit that can be attached to a ceiling guided vehicle in a simplest possible manner, and whose orientation is stable after the attachment.

Here, it is preferable that both the supporting portion and the abutment areas are provided on the body portion.

That is, the auxiliary unit is supported on the body portion and abuts against the abutment area provided on the body portion, and therefore, the orientation of the auxiliary unit can be further stabilized even when the ceiling guided vehicle vibrates during traveling.

It is preferable that the abutment portion includes a pair of abutting parts, the pair of abutting parts are disposed separately on opposite sides in a lateral width direction that is orthogonal to a traveling direction of the ceiling guided vehicle in plan view in a mounted state in which the auxiliary unit is mounted to the ceiling guided vehicle, and each of the pair of abutting parts is configured to be switchable between a hold orientation in which the abutting part is caused to abut against the corresponding abutment area, and a hold-release orientation in which the abutting part is moved away from the abutment area, by being pivoted about a vertical axis.

That is, the operation of hooking the supported portion of the auxiliary unit on the supporting portion of the ceiling guided vehicle can be performed by switching each of the pair of abutting parts to the hold-release orientation, without the pair of abutting parts obstructing the operation.

Furthermore, by switching each of the pair of abutting parts to the hold orientation in a state in which the supported portion of the auxiliary unit is hooked on the supporting portion of the ceiling guided vehicle so as to be suspended and supported thereon, the pair of abutting parts abuts against the abutment areas provided on opposite sides of the ceiling guided vehicle in the lateral width direction. Thus, the position of the auxiliary unit is maintained such that the pair of abutting parts sandwich the body portion from the opposite sides in the lateral width direction.

Accordingly, even when a ceiling guided vehicle vibrates as the ceiling guided vehicle travels, it is possible to prevent a situation where the auxiliary unit moves relative to the ceiling guided vehicle in the lateral width direction.

It is preferable that each of the pair of abutting parts is configured to press the corresponding abutment area in a state in which the abutting part is in the hold orientation, and each of the pair of abutting parts is provided with a pressing force adjustment mechanism for adjusting a pressing force for pressing the abutment area.

Since each of the pair of abutting parts presses the corresponding abutment area in the hold orientation, the auxiliary unit can be firmly held to the ceiling guided vehicle.

Furthermore, when each of the pair of abutting parts presses the corresponding abutment area, if the pressing force is too strong, the abutting part, the abutment area of the ceiling guided vehicle and the like may be damaged. For this reason, it is preferable that the pressing force with which the abutting part presses the abutment area is set to an appropriate force, taking into consideration the material and the like of the abutting part and the abutment area of the ceiling guided vehicle. With the present configuration, the pressing force with which each of the pair of abutting parts presses the abutment area can be adjusted by the pressing force adjustment mechanism. Accordingly, the pressing force with which the abutting part presses the abutment area can be set to an appropriate force, thus preventing a situation where the abutting part and the abutment area of the ceiling guided vehicle are damaged.

That is, with the present configuration, the auxiliary unit can be firmly held to the ceiling guided vehicle. Moreover, the pressing force with which the abutting part presses the abutment area can be set to an appropriate force, thus preventing a situation where the abutting part and the abutment area of the ceiling guided vehicle are damaged.

It is preferable that the auxiliary unit is configured such that, in a mounted state in which the auxiliary unit is mounted to the ceiling guided vehicle, a suspension fulcrum at the supported portion is located at a gravity center position in a lateral width direction that is orthogonal to a traveling direction of the ceiling guided vehicle in plan view.

That is, when the auxiliary unit is in the mounted state, the suspension fulcrum of the auxiliary unit is located at the gravity center position of the auxiliary unit in the lateral width direction, and it is thus possible to mount the auxiliary unit to the ceiling guided vehicle in a stable orientation in the lateral width direction.

What is claimed is:

1. An article transport facility comprising:
a plurality of ceiling guided vehicles that travel along a traveling rail provided on a ceiling side, wherein each of the ceiling guided vehicle includes:
a holding portion that holds an article to be transported;
a body portion that supports the holding portion such that the holding portion can be moved up and down;
a power-driven travel driving portion that drives the ceiling guided vehicle to travel;
a power-driven elevation driving portion that drives the holding portion to move up and down; and
a control portion that outputs a control signal and controls operation of the travel driving portion and the elevation driving portion;
an auxiliary unit that supplies, to the ceiling guided vehicle, one or both of power for driving the travel driving portion and the elevation driving portion and the control signal, the auxiliary unit provided so as to be attachable to and removable from the ceiling guided vehicle, the auxiliary unit including a supported portion configured to be supported in a suspended state on a supporting portion provided on the ceiling guided vehicle; and
an abutment portion configured to abut against the ceiling guided vehicle in a plurality of abutment areas disposed at different positions in plan view,
wherein the abutment portion includes a pair of abutting parts,
wherein each of the pair of abutting parts is configured to be switchable between a hold orientation in which the abutting part is caused to abut against the corresponding abutment area, and a hold-release orientation in which the abutting part is moved away from the abutment area, and
wherein the abutment areas are provided at positions lower than the supporting portion in a vertical direction.

2. The article transport facility according to claim 1, wherein both the supporting portion and the abutment areas are provided on the body portion.

3. The article transport facility according to claim 1, wherein the supporting portion includes a part extending from the body portion, and
wherein the supported portion is supported in a suspended state by hooking the supported portion to the part of the supporting portion.

4. The article transport facility according to claim 1, wherein both the supporting portion and the abutment area are provided on the body portion, and
wherein the auxiliary unit is mounted to the ceiling guided vehicle in a state in which the pair of abutting parts embrace the body portion.

5. An article transport facility comprising:
a plurality of ceiling guided vehicles that travel along a traveling rail provided on a ceiling side, wherein each of the ceiling guided vehicles includes:
a holding portion that holds an article to be transported;
a body portion that supports the holding portion such that the holding portion can be moved up and down;
a power-driven travel driving portion that drives the ceiling guided vehicle to travel;
a power-driven elevation driving portion that drives the holding portion to move up and down; and
a control portion that outputs a control signal and controls operation of the travel driving portion and the elevation driving portion;
an auxiliary unit that supplies, to the ceiling guided vehicle, one or both of power for driving the travel driving portion and the elevation driving portion and the control signal, the auxiliary unit provided so as to be attachable to and removable from the ceiling guided vehicle, the auxiliary unit including a supported portion configured to be supported in a suspended state on a supporting portion provided on the ceiling guided vehicle; and an abutment portion configured to abut against the ceiling guided vehicle in a plurality of abutment areas disposed at different positions in plan view, wherein the abutment areas are provided at positions lower than the supporting portion in a vertical direction, wherein both the supporting portion and the abutment areas are provided on the body portion, wherein the abutment portion includes a pair of abutting parts, wherein the pair of abutting parts are disposed separately on opposite sides in a lateral width direction that is orthogonal to a traveling direction of the ceiling guided vehicle in plan view in a mounted state in which the auxiliary unit is mounted to the ceiling guided vehicle, and wherein each of the pair of abutting parts is configured to be switchable between a hold orientation in which the abutting part is caused to abut against the corresponding abutment area, and a hold-release orientation in which the abutting part is moved away from the abutment area, by being pivoted about a vertical axis.

6. The article transport facility according to claim 5, wherein:

each of the pair of abutting parts is configured to press the corresponding abutment area in a state in which the abutting part is in the hold orientation, and each of the pair of abutting parts is provided with a pressing force adjustment mechanism for adjusting a pressing force for pressing the abutment area.

7. An article transport facility comprising:

a plurality of ceiling guided vehicles that travel along a traveling rail provided on a ceiling side, wherein each of the ceiling guided vehicle includes:

a holding portion that holds an article to be transported;

a body portion that supports the holding portion such that the holding portion can be moved up and down;

a power-driven travel driving portion that drives the ceiling guided vehicle to travel;

a power-driven elevation driving portion that drives the holding portion to move up and down; and a control portion that outputs a control signal and controls operation of the travel driving portion and the elevation driving portion;

an auxiliary unit that supplies, to the ceiling guided vehicle, one or both of power for driving the travel driving portion and the elevation driving portion and the control signal, the auxiliary unit provided so as to be attachable to and removable from the ceiling guided vehicle, the auxiliary unit including a supported portion configured to be supported in a suspended state on a supporting portion provided on the ceiling guided vehicle; and an abutment portion configured to abut against the ceiling guided vehicle in a plurality of abutment areas disposed at different positions in plan view, wherein the abutment areas are provided at positions lower than the supporting portion in a vertical direction, and wherein the auxiliary unit is configured such that, in a mounted state in which the auxiliary unit is mounted to the ceiling guided vehicle, a suspension fulcrum at the supported portion is located at a gravity center position in a lateral width direction that is orthogonal to a traveling direction of the ceiling guided vehicle in plan view.

* * * * *